United States Patent
Kang et al.

(10) Patent No.: US 7,195,854 B2
(45) Date of Patent: Mar. 27, 2007

(54) PHOTORESIST COMPOSITION

(75) Inventors: Hoon Kang, Gyeonggi-Do (KR);
Seung-uk Lee, Gyeonggi-Do (KR);
Woo-sik Jun, Gyeonggi-Do (KR);
Dae-youn Park, Gyeonggi-Do (KR);
Ju-hyuk Kim, Gyeonggi-Do (KR);
Byung-uk Kim, Gyeonggi-Do (KR)

(73) Assignee: Dongjin Semichem Co., Ltd. (KR)

(*) Notice: Subject to any disclaimer, the term of this patent is extended or adjusted under 35 U.S.C. 154(b) by 0 days.

(21) Appl. No.: 11/174,872

(22) Filed: Jul. 5, 2005

(65) Prior Publication Data

US 2006/0008728 A1    Jan. 12, 2006

(30) Foreign Application Priority Data

Jul. 5, 2004    (KR) .................. 10-2004-0052124

(51) Int. Cl.
*G03F 7/023*    (2006.01)
(52) U.S. Cl. .................. 430/191; 430/192; 430/193; 430/326
(58) Field of Classification Search ................ 430/191, 430/192, 193, 326
See application file for complete search history.

(56) References Cited

U.S. PATENT DOCUMENTS

| | | | |
|---|---|---|---|
| 3,666,473 A | 5/1972 | Colom et al. ............... | 96/91 D |
| 4,115,128 A | 9/1978 | Kita ............................ | 96/91 D |
| 4,550,069 A | 10/1985 | Pampalone ................. | 430/165 |
| 5,004,672 A * | 4/1991 | D'Ottavio et al. .......... | 205/184 |
| 5,314,789 A * | 5/1994 | Hawkins et al. ............ | 430/325 |
| 5,908,377 A * | 6/1999 | Fukuda ....................... | 516/102 |
| 6,323,275 B2 * | 11/2001 | Takahashi et al. .......... | 524/765 |
| 2004/0170925 A1 * | 9/2004 | Roach et al. ............ | 430/281.1 |

* cited by examiner

*Primary Examiner*—John S. Chu
(74) *Attorney, Agent, or Firm*—Cantor Colburn LLP

(57) ABSTRACT

The present invention provides a photoresist composition and more particularly, a photoresist composition comprising a) a novolak resin, b) a diazide compound, and c) a solvent containing propylene glycol methyl ether acetate (PGMEA) and 2,2,4-triemthyl-1,3-penthanediolmonoisobutylate (TMPMB). The photoresist composition according to the invention has excellent coating uniformity and stain inhibitory properties after coating so that it can be easily applied to real industrial fields and it can improve working environments due to the reduction of amounts to be consumed, the decrease of time to be required for manufacture, etc. when manufactured on a large scale.

17 Claims, No Drawings

PHOTORESIST COMPOSITION

BACKGROUND OF THE INVENTION

1. Field of the Invention

The present invention relates to photoresist compositions and more particularly, it relates to photoresist compositions which have excellent coating uniformity and stain inhibitory properties after coating so that they can be easily applied to real industrial fields and which can improve working environments due to the reduction of amounts to be consumed, the decrease of time to be required for manufacture, etc. when manufactured on a large scale.

2. Description of Related Art

In order to form fine circuit patterns such as liquid crystal display device circuits or semiconductor integrated circuits, insulated membranes or conductive metal membranes formed on substrates are coated with photoresist compositions, and then the coated photoresist compositions are exposed to light in the presence of a mask having a prescribed configuration and then developed to form a pattern of a desired configuration. Thereafter, the metal membranes or insulated membranes are etched using the photoresist membranes on which the patterns are formed, as a mask and then, the remaining photoresist membranes are eliminated to form fine circuits on the substrates.

In general, spin coating or slit coating methods are employed for the above-mentioned coating. These coating methods have merits in that they enable the formation of uniform photoresist membranes. The coating uniformity is a scale to show how uniform the thickness of coated photoresists is on entire substrates, and the higher the coating uniformity is, the more easily safe properties can be secured in subsequent processes. Consequently, large quantities of solvents were consumed to form uniform, stain-free photoresist membranes.

Generally, the photoresist compositions comprise polymeric resins, photosensitive compounds and solvents, and numerous attempts have been made to improve the coating uniformity, photographic speed, development contrast, and human safety.

In particular, U.S. Pat. No. 3,666,473 discloses the use of mixtures of two phenolformaldehyde novolak resins and typical photosensitive compounds, U.S. Pat. No. 4,115,128 discloses addition of organic acid cyclic anhydrides to phenolic resins and naphtoquinone diazide photoresists to increase photographic speed, and U.S. Pat. No. 4,550,069 discloses use of novolak resins and o-quinone diazide photosensitive compounds, and propylene glycol alkyl ether acetate as a solvent to increase coating uniformity and photographic speed and to improve human safety.

Further, various solvents have been developed in spin coating methods for the improvement of the properties of photoresist compositions for liquid crystal display devices and working stability and for example, they include ethyleneglycol monoethyletheracetate, propyleneglycol monoethyletheracetate, ethyllactate, and so on. However, ethyleneglycol monoethyletheracetate was known to have serious side effects against human safety, propyleneglycol monoethyletheracetate has inferiority due to pin marks after baking process in jumbo substrates such as TFT-LCD and also has lowered flatness when used as a sole solvent, and in case of the use of ethyllactate, adhesion of the compositions to substrates is poor and it is difficult to obtain uniform coating.

In case of slit coating methods, since there is no centrifugal force as in spin coating methods, solvents with excellent flatness are required for uniform coating properties.

Therefore, there are still demands on photoresist compositions suitable for each individual industrial field without sacrificing any one of the preferred properties of photoresist compositions such as coating uniformity, coating stain properties, photographic speed, rate of residual membranes, development contrast, resolution, solubility of polymeric resins, adhesion to substrates and circuit line width uniformity.

SUMMARY OF THE INVENTION

In order to solve the problems of the prior arts, it is an object of the present invention to provide a photoresist composition with excellent properties in every aspect of coating uniformity, coating stain properties, photosensitive speed, rate of residual membranes, development contrast, resolution, solubility of polymeric resins, adhesion to substrates, and circuit line width uniformity and a method of manufacturing a liquid crystal display device or semiconductor element by using the composition.

It is another object of the invention to a photoresist composition having excellent coating uniformity and stain inhibitory properties after slit coating so that it can be easily applied to real industrial fields and capable of improving working environments due to the reduction of amounts to be consumed, the decrease of time to be required for manufacture, etc. when manufactured on a large scale and a method of manufacturing a liquid crystal display device or semiconductor element by using the composition.

To achieve the aforementioned objects, the present invention provides a photoresist composition comprising:
 a) a novolak resin
 b) a diazide compound; and
 c) a solvent containing propylene glycol methyl ether acetate (PGMEA) and 2,2,4-triemethyl- 1,3 -penthanediol-monoisobutylate (TMPMB).

Preferably, the invention comprises;
 a) 5 to 30 % by weight of a novolak resin
 b) 2 to 10 % by weight of a diazide compound; and
 c) 60 to 90 % by weight of a solvent containing propylene glycol methyl ether acetate and 2,2,4-triemethyl- 1,3-penthanediolmonoisobutylate.

Further, the invention provides a method of manufacturing a liquid crystal display device or semiconductor element by using the photoresist composition.

DETAILED DESCRIPTION OF THE INVENTION

The invention is further described in detail.

The photoresist composition of the present invention is characterized in that it comprises a) a novolak resin, b) a diazide compound, and c) a solvent containing propylene glycol methyl ether acetate (PGMEA) and 2,2,4-triemethyl- 1,3-pentanediolmonoisobutylate (TMPMB).

Several kinds of polymeric resins are known to be used in photoresist compositions. The polymeric resin used in the present invention is the novolak resin of a), which is a polymer synthesized by reacting aromatic alcohols (meta cresol or para cresol) and formaldehyde and it is preferable to mix the meta cresol and para cresol in a ratio of 40:60 to 60:40 by weight. When they are used within the abovementioned ranges, they can prevent problems such as increase of photographic speed and abrupt decrease of rate of residual membranes due to excessive amount of meta cresol and also they can solve problems such as decrease of photographic speed due to the excessive amount of para cresol and prevent flow of pattern due to heat after hard-bake process. More preferably, the meta cresol and the para cresol are used in a ratio of 50:50 by weight.

The novolak resin of a) is contained in the photoresist composition of the invention preferably in an amount of 5 to 30% by weight. When the amount of the novolak resin is less than 5% by weight, viscosity is too low to coat photoresist compositions in a desired thickness and on the other hand, when it exceeds 30% by weight, viscosity is too high to obtain uniform coating of substrates.

The diazide compound of b) in the present invention is used as a photosensitive compound. The diazide compound can be prepared by reacting polyhydroxy benzophenone and diazide compounds such as 1,2-naphtoquinone and 2-diazo-1-naphtol-5-sulfonic acid.

Preferably, the diazide compound is 2,3,4-trihydroxybenzophenone-1,2-naphthoquinonediazide-5-sulfonate prepared by esterification of trihydroxy benzophenone and 2-diazo-1-naphtol-5-sulfonic acid, 2,3,4,4-tetrahydroxybenzophenone-1,2-naphthoquinonediazide-5-sulfonate prepared by esterification of tetrahydroxy benzophenone and 2-diazo-1-naphtol-5-sulfonic acid, and mixture thereof. More preferably, 2,3,4-trihydroxybenzophenone-1,2-naphthoquinonediazide-5-sulfonate and 2,3,4,4-tetrahydroxybenzophenone-1,2-naphthoquinonediazide-5-sulfonate are used in a ratio of 40:60 to 60:40 by weight, much more preferably, 50:50 by weight.

The diazide compound of b) is contained in the photoresist composition of the invention preferably in an amount of 2 to 10% by weight. When the amount of the diazide compound is less than 2% by weight, photographic speed is getting too fast thereby causing extreme decrease in rate of residual membranes, and when it exceeds 10% by weight, the photographic speed is getting too slow. Also, the photoresist composition of the invention comprises the solvent containing propylene glycol methyl ether acetate (PGMEA) and 2,2,4-triemethyl-1,3-penthanediolmonoisobutylate (TMPMB) of c).

The PGMEA and TMPMB are mixed preferably in a ratio of 60:40 to 95:5 by weight and more preferably, in a ratio of 80:20 by weight. When the amount of PGMEA is within the above range, it can solve the decrease of coating uniformity due to reduced flow after silt coating as well as difficulty of forming stable photoresist membranes due to decreased volatility of solvents after slit coating.

The PGMEA of the solvent used in the invention can be used in a mixture with ethyl lactate (EL), methyl methoxy propionate (MMP), or propylene glycol methyl ether (PGME). When the PGMEA is mixed with ethyl lactate (EL), methyl methoxy propionate (MMP), or propylene glycol methyl ether (PGME), it is preferred that the amount of PGMEA is at least 50% by weight in aspects of coating uniformity and stain prevention.

The solvent of c) in the photoresist composition of the invention is used in the remaining amount except the resin and the photosensitive agent and preferably, it is contained in an amount of 60 to 90% by weight. Using the solvent within the above-mentioned range is advisable for coating uniformity and coating stain properties.

The photoresist composition for liquid crystal display device circuit of the invention comprising the above-mentioned components, if necessary, can further comprise additives such as colorants, dyes, anti-striation agents, plasticizers, adhesion promoter, speed enhancers, or surfactants in an amount to be added as a usual additive, thereby assisting the enhancement of performance according to the nature of individual processes.

Also, the invention provides a method of manufacturing a liquid crystal display device or semiconductor element by using the photoresist composition, which is characterized in that the photoresist composition of the invention is employed in conventional methods for the manufacture of liquid crystal display devices or semiconductor elements using photoresist compositions.

Particularly, for the liquid crystal display devices, the following methods can be carried out. First, substrates are coated with the photoresist composition of the invention by slit coating. Coatings with a desired thickness can be formed by suitably adjusting the amount of solids in the photoresist solution according to the type and the manner of a slit coating machine.

For the substrates, there can be used silicon, aluminum, silicon dioxide, doped silicon dioxide, silicon nitride, tantalum, copper, poly silicon, ceramic, aluminum/copper mixture, or various polymeric resins.

The photoresist composition coated on the substrates by the above-mentioned method is subject to vacuum drying process by placing it under the condition of a reduced pressure below a room pressure for certain time to eliminate the remaining solvent.

Then, soft bake process is carried out by heating it to the temperature of 20 to 130° C. This thermal treatment is carried out to evaporate the solvent while not degrading the solid components of the photoresist composition for liquid crystal display device circuit. Generally, it is preferable to minimize the concentration of the solvent in the soft bake process. Hence, such thermal treatment is preferably carried out until most solvents are evaporated and thus thin coating membrane of the photoresist composition for liquid crystal display device circuit in a thickness of not more than 2 µm remains on the substrates.

Next, the substrate with the photoresist membrane formed thereon is exposed to light, especially, UV by using a suitable mask or stencil to form a pattern with a desired configuration. The exposed substrate is sufficiently soaked in an alkali development aqueous solution and then maintained until the photoresist membrane in the exposed region is completely or almost dissolved. The development aqueous solution is preferably an aqueous solution containing alkali hydroxide, ammonium hydroxide or tetramethylammonium hydroxide.

After the substrate from which the exposed region is dissolved and removed is taken out from the development solution, it is subject to thermal treatment again through hard bake process so that the adhesion and chemistry resistance of the photoresist membrane are enhanced. This thermal treatment is preferably carried out at a temperature below the softening point of the photoresist membrane, in particular, at the temperature of 90 to 140° C.

The exposed region of the substrate where the development process is complete is treated with corrosive solution or gas plasma. In this process, the region of the substrate that is not exposed is protected by the photoresist membrane. After the treatment of the substrate, the photoresist membrane is removed by a suitable stripper to form a fine circuit pattern on the substrate.

The photoresist composition and the method for the manufacture of liquid crystal display devices and semiconductor elements using the photoresist composition according to the invention are especially suitable for the manufacture of liquid crystal display devices using slit coating, and it shows excellent performances in every aspect of coating uniformity, coating stain properties, photosensitive speed, rate of residual membranes, development contrast, resolution, solubility of polymeric resins, adhesion to substrates, and circuit line width uniformity and further, it can be readily applied to real industrial fields and improve working environments due to the reduction of amounts to be consumed, the decrease of time to be required for manufacture, etc. when manufactured on a large scale.

For better understanding of the present invention, preferred embodiments follow. The following examples are intended to illustrate the invention more fully without limiting the scope of the invention.

EXAMPLE 1

The photoresist composition was prepared by evenly mixing 20 g of novolak resin where meta cresol and para cresol are present in a ratio of 4:6 by weight as a novolak resin, 4 g of 2,3,4,4-tetrahydroxybenzophenone- 1,2-naphthoquinonediazide-5 -sulfonate as a photosensitive compound, and 60 g of propylene glycol methyl ether acetate (PGMEA) and 16 g of 2,2,4-trimethyl1-1,3-penthanediol-monoisobutylate (TMPMB) as a solvent.

EXAMPLE 2 & COMPARATIVE EXAMPLES 1 TO 3

The photoresist compositions were prepared by the same method as in Example 1 except that the components shown in Table 1 below were used in the given amounts. The unit in Table 1 is gram.

TABLE 1

|  |  | Ex. 1 | Ex. 2 | Com. Ex. 1 | Com. Ex. 2 | Com. Ex. 3 |
|---|---|---|---|---|---|---|
| Polymer resin |  | 20 | 20 | 20 | 20 | 20 |
| Photoresist compound |  | 4.0 | 4.0 | 4.0 | 4.0 | 4.0 |
| Solvent | PGMEA | 60 | 50 | 76 | 50 | 40 |
|  | TMPMB | 16 | 26 | — | — | — |
|  | EL | — | — | — | 26 | — |
|  | nBA | — | — | — | — | 26 |

[Note]
EL: Ethyl lactate
nBA: Normal butyl acetate

The photoresist compositions for liquid crystal display device circuits prepared by above Examples 1 and 2 and Comparative Examples 1 to 3 were each slit-coated on glass substrates of 0.7 T (thickness, 0.7 mm) at a certain speed, which were then dried under a reduced pressure of 0.6 Torr for 60 sec. and dried by heat at 115° C. for 90 sec., thereby forming film membranes in a thickness of 1.50 μm. Thereafter, the thickness uniformity and coating stain properties of the film membranes were measured by the following procedure and the results are shown in Table 3 below.

a) Thickness uniformity— The photoresist film membranes which were slit-coated on the glass substrates in width 400 mm×length 400 mm and dried by heat were evaluated by measuring their thickness total 300 times of width 20 times and length 15 times, and thickness uniformity was calculated by the following formula using the obtained maximum and minimum thickness.

Thickness Uniformity=(Max. Thickness−Min. Thickness)/(Max. Thickness+Min. Thickness)×100 b) Coating stain properties—After slit-coated on the glass substrates in width 400 mm×length 300 mm and dried by heat, the photoresist film membranes were examined with naked eyes using halogen lamp for surface observation and evaluated according to the degree of transverse striped patterns. The evaluation criteria for coating stain properties are shown in Table 2 below.

TABLE 3

|  | Ex. 1 | Ex. 2 | Com. Ex. 1 | Com. Ex. 2 | Com. Ex. 3 |
|---|---|---|---|---|---|
| Coating uniformity (%) | 2.16 | 1.84 | 5.28 | 4.21 | 8.81 |
| Stain properties | ○ | ◎ | X | Δ | X |

It can be seen from above Table 3 that the photoresist membranes produced by using the photoresist compositions of Example 1 or 2 prepared in accordance with the present invention had excellent coating uniformity and stain properties, compared with those of Comparative Examples 1 to 3.

The photoresist composition and the method for the manufacture of liquid crystal display devices and semiconductor elements using the photoresist composition according to the invention are especially suitable for the manufacture of liquid crystal display devices using slit coating, and it shows excellent performances in every aspect of coating uniformity, coating stain properties, photosensitive speed, rate of residual membranes, development contrast, resolution, solubility of polymeric resins, adhesion to substrates, and circuit line width uniformity and further, it can be readily applied to real industrial fields and improve working environments due to the reduction of amounts to be consumed, the decrease of time to be required for manufacture, etc. when manufactured on a large scale.

What is claimed is:

1. A photoresist composition comprising:
    a) a novolak resin
    b) a diazide compound; and
    c) a solvent containing propylene glycol methyl ether acetate (PGMEA) and 2,2,4-trimethyl-1,3-pentanediol-monoisobutyrate (TMPMB).

2. The photoresist composition of claim 1 comprising
    a) 5 to 30% by weight of the novolak resin
    b) 2 to 10% by weight of the diazide compound; and
    c) 60 to 90% by weight of the solvent containing propylene glycol methyl ether acetate and 2,2,4-trimethyl-1,3pentanediolmonoisobutyrate.

3. The photoresist composition of claim 1 wherein in the solvent of c), the propylene glycol methyl ether acetate and the 2,2,4-trimethyl-1,3-pentanediolmonoisobutyrate are mixed in a ratio of 60:40 to 95:5 by weight.

4. The photoresist composition of claim 1 wherein in the solvent of c), the propylene glycol methyl ether acetate and the 2,2,4-trimethyl-1,3-pentanediolmonoisobutyrate are mixed in a ratio of 80:20 by weight.

5. The photoresist composition of claim 1 wherein the novolak resin of a) comprises meta cresol and para cresol in a ratio of 40:60 to 60:40 by weight.

6. The photoresist composition of claim 1 wherein the diazide compound of b) comprises 2,3,4-trihydroxybenzophenone-1,2-naphtquinonediazide-5-sulfonate and 2,3,4,4-tetrahydroxybenzophenone-1,2-naphthoquinonediazide-5-sulfonate in a ratio of 40:60 to 60:40 by weight.

7. The photoresist composition of claim 1 further comprising one or more additives selected from the group consisting of colorants, dyes, anti-striation agents, plasticizers, adhesion promoter, speed enhancers and surfactants.

8. The photoresist composition of claim 1 wherein the photoresist composition is used for manufacture of a liquid crystal display device circuit.

9. A method of manufacturing a liquid crystal display device or semiconductor element comprising:
   coating the photoresist composition of claim 1 on a substrate;
   drying or baking the coated substrate;
   exposing the baked substrate to light to form a pattern; and
   developing the patterned substrate.

10. The method of claim 9 wherein the method is the manufacture of a liquid crystal display device circuit using slit coating.

11. The method of claim 9, wherein the photoresist composition comprises:
   a) 5 to 30% by weight of the novolak resin
   b) 2 to % by weight of the diazide compound; and
   c) 60 to 90% by weight of the solvent containing propylene glycol methyl ether acetate and 2,2,4-trimethyl-1,3-pentanediolmonoisobutyrate.

12. The method of claim 9 wherein in the solvent of c), the propylene glycol methyl ether acetate and the 2,2,4-trimethyl-1,3-pentanediolmonoisobutyrate mixed in a ratio of 60:40 to 95:5 by weight.

13. The method of claim 9 wherein in the solvent of c), the propylene glycol methyl ether acetate and the 2,2,4-trimethyl-1,3-pentanediolmonoisobutyrate to mixed in a ratio of 80:20 by weight.

14. The method of claim 9 wherein the novolak resin of a) comprises meta cresol and para cresol in a ratio of 40:60 to 60:40 by weight.

15. The method of claim 9 wherein the diazide compound of b) comprises 2,3,4-trihydroxybenzophenone-1,2-naphthoquinonediazide-5-sulfonate and 2,3,4,4-tetrahydroxybenzophenone-1,2-naphthoquinonediazide-5-sulfonate in a ratio of 40:60 to 60:40 by weight.

16. The method of claim 9 wherein the photoresist composition further comprises one or more additives selected from the group consisting of colorants, dyes, anti-striation agents, plasticizers, adhesion promoter, speed enhancers and surfactants.

17. The method claim 9 wherein the photoresist composition is used for manufacture of a liquid crystal display device circuit.

* * * * *